United States Patent
Ausserlechner

(10) Patent No.: US 11,249,145 B2
(45) Date of Patent: Feb. 15, 2022

(54) MAGNETIC FIELD SENSING

(71) Applicant: Infineon Technologies AG, Neubiberg (DE)

(72) Inventor: Udo Ausserlechner, Villach (AT)

(73) Assignee: Infineon Technologies AG

(*) Notice: Subject to any disclaimer, the term of this patent is extended or adjusted under 35 U.S.C. 154(b) by 87 days.

(21) Appl. No.: 16/740,929

(22) Filed: Jan. 13, 2020

(65) Prior Publication Data

US 2020/0225297 A1 Jul. 16, 2020

(30) Foreign Application Priority Data

Jan. 16, 2019 (DE) .................. 102019000254.7

(51) Int. Cl.
*G01R 33/00* (2006.01)
*G01R 33/07* (2006.01)
*G01R 33/09* (2006.01)

(52) U.S. Cl.
CPC ..... *G01R 33/0064* (2013.01); *G01R 33/0023* (2013.01); *G01R 33/077* (2013.01); *G01R 33/093* (2013.01); *G01R 33/096* (2013.01); *G01R 33/098* (2013.01)

(58) Field of Classification Search
CPC ............ G01R 33/0064; G01R 33/0023; G01R 33/077
See application file for complete search history.

(56) References Cited

U.S. PATENT DOCUMENTS

| | | | |
|---|---|---|---|
| 7,508,200 B2* | 3/2009 | Kahlman | B82Y 25/00 324/207.12 |
| 7,923,987 B2 | 4/2011 | Ausserlechner | |
| 10,837,943 B2* | 11/2020 | Romero | G01D 5/145 |
| 2014/0253106 A1* | 9/2014 | Granig | G01D 5/165 324/207.14 |
| 2014/0333295 A1* | 11/2014 | Fernandez | G01B 7/003 324/207.12 |
| 2015/0160307 A1 | 6/2015 | Kim et al. | |

FOREIGN PATENT DOCUMENTS

| | | |
|---|---|---|
| CN | 101065660 A | 10/2007 |
| CN | 102147453 A | 8/2011 |
| CN | 102426344 A | 4/2012 |
| DE | 102008050018 A1 | 4/2009 |
| DE | 102016014455 A1 | 6/2018 |
| JP | 2008281473 A | 11/2008 |

* cited by examiner

Primary Examiner — Reena Aurora
(74) Attorney, Agent, or Firm — Design IP

(57) ABSTRACT

A sensing element is provided including a magnetic sensor that detects a first magnetic field component, at least one AC-magnetic field generator that applies at least one additional magnetic field component at a given frequency to the magnetic sensor, where the first magnetic field component and the at least one additional magnetic field component are orthogonal to each other, and at least one demodulator using the given frequency to determine a sensitivity of the sensing element respective to the at least one additional magnetic field component. Also, several methods of operating such sensing element are provided.

26 Claims, 2 Drawing Sheets

MAGNETIC FIELD SENSING

BACKGROUND

Examples described herein refer to magnetic sensors, which in an ideal scenario may respond to a magnetic field in a $1^{st}$ direction only. However, the magnetic sensors may also respond to a magnetic field in a $2^{nd}$ direction, which is orthogonal to the $1^{st}$ direction, wherein this response to the $2^{nd}$ direction is called crosstalk between the $1^{st}$ direction and the $2^{nd}$ direction.

Usually, magnetic crosstalk is unwanted. Examples described herein further refer to a solution that allows detecting the amount of crosstalk. Hence, a correction can be done based on the detected crosstalk.

An example of unwanted crosstalk includes a vertical Hall effect device may be aligned in x-direction, i.e. the contacts are spaced apart in x-direction. Such device can be used to detect the y-component $B_y$ of the magnetic field. It is noted that instead of the vertical Hall effect device any magnetoresistive (MR) sensor may be used. Such MR sensor may comprise at least one of the following: an AMR (Anisotropic MR) sensor, a GMR (Giant MR) sensor, a TMR (Tunneling MR) sensor. The approach presented could be used in combination with MR sensors, Hall plates or vertical Hall effect devices.

Assuming that this is an ideal device without any unwanted errors, it will not respond to any magnetic field $B_x$ in x-direction or any magnetic field $B_z$ in z-direction. However, if a mechanical stress impacts the device, it might also respond to the magnetic field components $B_x$ and/or $B_z$. This situation may be summarized as follows:

$$S_{outy} = S_{yx} \cdot B_x + S_{yy} \cdot B_y + S_{yz} \cdot B_z,$$

where:
- $S_{outy}$ is an output signal of the device,
- $S_{yy}$ is a magnetic sensitivity of the device with respect to the magnetic field component in y-direction ($B_y$),
- $S_{yx}$ is a magnetic sensitivity of the device with respect to the magnetic field component in x-direction ($B_x$), and
- $S_{yz}$ is a magnetic sensitivity of the device with respect to the magnetic field component in z-direction ($B_z$).

Usually, the following applies:

$$|S_{yx}| \ll |S_{yy}| \text{ and } |S_{yz}| \ll |S_{yy}|,$$

because the magnetic sensor is designed to predominately measure the magnetic field component $B_y$ instead of the other magnetic field components $B_x$ and/or $B_z$.

Hence, the magnetic sensitivities $S_{yx}$ and $S_{yz}$ are rather unwanted and may stem from errors caused by, e.g., mechanical stress.

It is noted, however, that mechanical stress is only one example that may result in magnetic crosstalk. There are several other phenomena, which may contribute to magnetic crosstalk as well, which may be inherent to the sensor device (such as mobile ions and out-diffusions, moisture ingress) and/or they may result from the environment (such as nearby ferrous objects which change their position during the lifetime of the sensor).

SUMMARY

Embodiments of the present invention relate to the sensing of a magnetic field, in particular at least one magnetic field component even if magnetic crosstalk is present.

The objective is to improve the sensing of magnetic fields components.

This is solved according to the features of the independent claims. Further embodiments result from the depending claims.

The examples suggested herein may in particular be based on at least one of the following solutions. Combinations of the following features may be utilized to reach a desired result. The features of the method could be combined with any feature(s) of the device, apparatus or system or vice versa.

A sensing element is suggested, which includes a magnetic sensor that detects a first magnetic field component; at least one AC-magnetic field generator that applies at least one additional magnetic field component at a given frequency to the magnetic sensor, where the first magnetic field component and the at least one additional magnetic field component are orthogonal to each other; and at least one demodulator using the given frequency to determine a sensitivity of the sensing element respective to the at least one additional magnetic field component.

According to an embodiment, the first magnetic field component is determined based on the at least one additional magnetic field component and being supplied by the at least one AC-magnetic field generator and on at least one additional magnetic sensor that detects the at least one additional magnetic field component.

It is noted that the at least one magnetic field component may be an electronic signal outside a baseband and that the magnetic field component detected by the at least one additional magnetic field component may be within the baseband. Hence, the additional sensor does not detect the magnetic field component that was generated by the AC-magnetic field generator.

According to an embodiment, determining the first magnetic field component $B_i$ includes:
  determining the sensitivity $$S_{ij} \text{ with } i,j \in \{x,y,z\} \text{ and } i \neq j$$

based on a demodulated and optionally filtered output signal $S_{ij} \cdot B_j'$ divided by the additional magnetic field component $B_j'$ as applied by the AC-magnetic field generator,
  multiplying the sensitivity $S_{ij}$ with an additional magnetic field component $B_j$ determined by the additional magnetic sensor.

According to an embodiment, the magnetic field component $B_i$ is determined based on:

$$B_i = \frac{S_{outi} - S_{ij} \cdot B_j}{S_{ii}},$$

wherein j can be any direction that is orthogonal to the direction i and wherein $S_{outi}$ is an output signal of the sensing element.

It is noted that the sensitivity $S_{ii}$ may be known by design.

It is an option that i may be the y-coordinate and j may be any of the x- or z-coordinates in a Cartesian coordinate system.

According to an embodiment, each AC-magnetic field generator is electrically shielded from the magnetic sensor.

According to an embodiment, the magnetic sensor is any of the following:
  a vertical Hall effect device,
  a Hall plate, or
  a magnetoresistive (MR) sensor, in particular at least one of the following sensors:
    an Anisotropic MR (AMR) sensor, a Giant MR (GMR) sensor, or a Tunneling MR (TMR) sensor.

According to an embodiment, the frequency or bandwidth of each of the AC-magnetic field generators is different from a frequency or bandwidth of the first magnetic field component.

The frequency used to drive the AC-magnetic field generator may in particular be low enough to avoid any detrimental eddy currents in conducting parts like the leadframe or the sensor package or the electric shield.

According to an embodiment, the at least one AC-magnetic field generator includes a wire or a coil.

A high-precision alignment of the wire or the coil with regard to the magnetic sensor may be preferable. It is an option that the wire or the coil is produced using the same manufacturing methods as the magnetic sensor.

According to an embodiment, the at least one AC-magnetic field generator is realized as a wire or coil on chip.

Hence, the wire or the coil may be located on the chip that also includes the magnetic sensor.

Also, a sensing system is provided to determine at least one magnetic field component including:
  a first magnetic sensing element that detects a first magnetic field component $B_y$ in y-direction, the first magnetic sensing element including:
    a first magnetic sensor,
    a first AC-magnetic field generator that applies a magnetic field component $B_x'$ in x-direction as crosstalk signals to the first magnetic sensor,
    a signal path to extract a signal $S_{yx} \cdot B_x'$, wherein $S_{yx}$ is a sensitivity in x-direction of the first magnetic sensor, and
  a second magnetic sensing element that detects a second magnetic field component $B_x$ in x-direction, the second magnetic sensing element including:
    a second magnetic sensor,
    a first AC-magnetic field generator that applies a magnetic field component $B_y'$ in y-direction as crosstalk signal to the second magnetic sensor,
    a signal path to extract a signal $S_{xy} \cdot B_y'$, wherein $S_{xy}$ is a sensitivity in y-direction of the second magnetic sensor,
  wherein the at least one magnetic field component $B_x$, $B_y$, is determined based on $$\begin{pmatrix} B_x \\ B_y \end{pmatrix} = \begin{bmatrix} S_{xx} & S_{xy} \\ S_{yx} & S_{yy} \end{bmatrix}^{-1} \cdot \begin{pmatrix} S_{outx} \\ S_{outy} \end{pmatrix},$$

wherein:
  $S_{outx}$ is an output signal of the second magnetic sensor,
  $S_{outy}$ is an output signal of the first magnetic sensor,
  wherein the sensitivities $S_{ij}$ with $i,j \in \{x, y\}$ and $i \neq j$ are determined based on the signals $S_{ij} \cdot B_j'$ divided by the known magnetic field component $B_j'$ as applied by the respective AC-magnetic field generator.

The sensitivities $S_{xx}$ and $S_{yy}$ may be known by design or they may be determined based on an additional AC-magnetic field generator.

The first magnetic sensor and the second magnetic sensor are arranged to detect main magnetic field components that are orthogonal to each other. In this example, $B_y$ is the main magnetic field component of the first magnetic sensor and $B_x$ is the main magnetic field component of the second magnetic sensor.

Advantageously, such sensing system can be used as an angle sensing system to determine an angle between the magnetic field component $B_x$ and the magnetic field component $B_y$.

According to an embodiment,
  the first magnetic sensing element further includes:
    a second AC-magnetic field generator that applies a magnetic field component $B_z'$ in z-direction as crosstalk signal to the first magnetic sensor, and
    a signal path to extract a signal $S_{yz} \cdot B_z'$, wherein $S_{yz}$ is a sensitivity in z-direction of the first magnetic sensor,
  the second magnetic sensing element further includes:
    a second AC-magnetic field generator that applies a magnetic field component $B_z'$ in z-direction as crosstalk signal to the second magnetic sensor, and
    a signal path to extract a signal $S_{xz} \cdot B_z'$, wherein $S_{xz}$ is a sensitivity in z-direction of the second magnetic sensor,
  a third magnetic sensing element is provided that detects a third magnetic field component $B_z$ in z-direction including:
    a third magnetic sensor,
    two AC-magnetic field generators that apply magnetic field components $B_x'$ and $B_y'$ in x-direction and y-direction as crosstalk signals to the third magnetic sensor,
    a signal path to extract a signal $S_{zx} \cdot B_x'$, wherein $S_{zx}$ is a sensitivity in x-direction of the third magnetic sensor, and
    a signal path to extract a signal $S_{zy} \cdot B_y'$, wherein $S_{zy}$ is a sensitivity in y-direction of the third magnetic sensor,
  wherein the at least one magnetic field component $B_x$, $B_y$, $B_z$ is determined based on $$\begin{pmatrix} B_x \\ B_y \\ B_z \end{pmatrix} = \begin{bmatrix} S_{xx} & S_{xy} & S_{xz} \\ S_{yx} & S_{yy} & S_{yz} \\ S_{zx} & S_{zy} & S_{zz} \end{bmatrix}^{-1} \cdot \begin{pmatrix} S_{outx} \\ S_{outy} \\ S_{outz} \end{pmatrix},$$

wherein:
  $S_{outz}$ is an output signal of the third magnetic sensor,
  wherein the sensitivities $S_{ij}$ with $i,j \in \{x, y, z\}$ and $i \neq j$ are determined based on the signals $S_{ij} \cdot B_j'$ divided by the known magnetic field component $B_j'$ as applied by the respective AC-magnetic field generator.

The sensitivities $S_{xx}$, $S_{yy}$ and $S_{zz}$ may be known by design or they may be determined based on an additional AC-magnetic field generator.

The first magnetic sensor, the second magnetic sensor and the third magnetic sensor may include at least one magnetic sensor element.

The first magnetic sensor, the second magnetic sensor and the third magnetic sensor are arranged to detect main magnetic field components that are orthogonal to each other. In this example, $B_y$ is the main magnetic field component of the first magnetic sensor, $B_x$ is the main magnetic field component of the second magnetic sensor and $B_z$ is the main magnetic field component of the third magnetic sensor.

According to an embodiment,
  each of the AC-magnetic field generators applies the magnetic field component $B_j'$ at a frequency $f_j$, and the signal path to extract the signal $S_{ij} \cdot B_j'$ includes a demodulator using the frequency $f_j$ and optionally a filter.

According to an embodiment, the frequency $f_j$ of each of the AC-magnetic field generators is different from a frequency or bandwidth of the magnetic field component $B_i$.

According to an embodiment, for each magnetic sensing element, the AC-magnetic field generator is electrically shielded from the magnetic sensor.

According to an embodiment, the magnetic sensor is any of the following:
a Vertical Hall effect device, or
a Hall plate.

A method is suggested for calculating a first magnetic field component, including:
detecting a first magnetic field component by a magnetic sensor,
applying via at least one AC-magnetic field generator at least one additional magnetic field component at a given frequency, wherein the first magnetic field component and the at least one additional magnetic field component are orthogonal to each other,
using the given frequency to determine a sensitivity of the sensing element respective to the at least one additional magnetic field component, and
determining the first magnetic field component based on the at least one additional magnetic field component supplied by the at least one AC-magnetic field generator and on at least one additional magnetic sensor that detects the at least one additional magnetic field component.

According to an embodiment, determining the first magnetic field component $B_i$ includes:
determining the sensitivity $$S_{ij} \text{ with } i,j \in \{x,y,z\} \text{ and } i \neq j$$

based on a demodulated and optionally filtered output signal $S_{ij} \cdot B_j'$ divided by the additional magnetic field component $B_j'$ as applied by the AC-magnetic field generator, and
multiplying the sensitivity $S_{ij}$ with an additional magnetic field component $B_j$ determined by the additional magnetic sensor.

According to an embodiment, the magnetic field component $B_i$ is determined based on $$B_i = \frac{S_{outi} - S_{ij} \cdot B_j}{S_{ii}},$$

wherein j can be any direction that is orthogonal to the direction i and wherein $S_{outi}$ is an output signal of the sensing element.

A method is provided for calculating at least one magnetic field component including:
a first magnetic sensing element that detects a first magnetic field component $B_y$ in y-direction including:
a first magnetic sensor,
a first AC-magnetic field generator that applies a magnetic field component $B_x'$ in x-direction as crosstalk signals to the first magnetic sensor,
a signal path to extract a signal $S_{yx} \cdot B_x'$, wherein $S_{yx}$ is a sensitivity in x-direction of the first magnetic sensor,
a second magnetic sensing element that detects a second magnetic field component $B_x$ in x-direction including:
a second magnetic sensor,
a first AC-magnetic field generator that applies a magnetic field component $B_y'$ in y-direction as crosstalk signal to the second magnetic sensor,
a signal path to extract a signal $S_{xy} \cdot B_y'$, wherein $S_{xy}$ is a sensitivity in y-direction of the second magnetic sensor,
wherein the at least one magnetic field component $B_x$, $B_y$, is determined based on $$\begin{pmatrix} B_x \\ B_y \end{pmatrix} = \begin{bmatrix} S_{xx} & S_{xy} \\ S_{yx} & S_{yy} \end{bmatrix}^{-1} \cdot \begin{pmatrix} S_{outx} \\ S_{outy} \end{pmatrix},$$

wherein:
$S_{outx}$ is an output signal of the second magnetic sensor,
Souty is an output signal of the first magnetic sensor,
wherein the sensitivities $S_{ij}$ with $i,j \in \{x, y\}$ and $i \neq j$ are determined based on the signals $S_{ij} \cdot B_j'$ divided by the known magnetic field component $B_j'$ as applied by the respective AC-magnetic field generator.

According to an embodiment,
the first magnetic sensing element further includes:
a second AC-magnetic field generator that applies a magnetic field component $B_z'$ in z-direction as crosstalk signal to the first magnetic sensor,
a signal path to extract a signal $S_{yz} \cdot B_z'$, wherein $S_{yz}$ is a sensitivity in z-direction of the first magnetic sensor,
the second magnetic sensing element further includes:
a second AC-magnetic field generator that applies a magnetic field component $B_z'$ in z-direction as crosstalk signal to the second magnetic sensor,
a signal path to extract a signal $S_{xz} \cdot B_z'$, wherein $S_{xz}$ is a sensitivity in z-direction of the second magnetic sensor,
a third magnetic sensing element is provided that detects a third magnetic field component $B_z$ in z-direction including:
a third magnetic sensor,
two AC-magnetic field generators that apply magnetic field components $B_x'$ and $B_y'$ in x-direction and y-direction as crosstalk signals to the third magnetic sensor,
a signal path to extract a signal $S_{zx} \cdot B_x'$, wherein $S_{zx}$ is a sensitivity in x-direction of the third magnetic sensor, and
a signal path to extract a signal $S_{zy} \cdot B_y'$, wherein $S_{zy}$ is a sensitivity in y-direction of the third magnetic sensor,
wherein the at least one magnetic field component $B_x$, $B_y$, $B_z$ is determined based on $$\begin{pmatrix} B_x \\ B_y \\ B_Z \end{pmatrix} = \begin{bmatrix} S_{xx} & S_{xy} & S_{xz} \\ S_{yx} & S_{yy} & S_{yz} \\ S_{zx} & S_{zy} & S_{zz} \end{bmatrix}^{-1} \cdot \begin{pmatrix} S_{outx} \\ S_{outy} \\ S_{outz} \end{pmatrix},$$

wherein:
Soutz is an output signal of the third magnetic sensor,
wherein the sensitivities $S_{ij}$ with $i,j \in \{x, y, z\}$ and $i \neq j$ are determined based on the signals $S_{ij} \cdot B_j'$ divided by the known magnetic field component $B_j'$ as applied by the respective AC-magnetic field generator.

According to an embodiment,
each of the AC-magnetic field generators applies the magnetic field component $B_j'$ at a frequency $f_j$,
the signal path to extract the signal $S_{ij} \cdot B_j'$ includes a demodulator using the frequency $f_j$ and optionally a filter.

According to an embodiment, the method is run continuously or intermittently.

It is noted that this crosstalk calibration can be run continuously or intermittently. Preferably, the bandwidth of crosstalk determination may be small, because usually the reasons for a change of crosstalk occur at a slow pace (the reasons may be based on mechanical stress or moisture). The calibration of the crosstalk may in particular be executed every second slower. This beneficially helps saving power.

Also, a computer program product is provided, which is directly loadable into a memory of a digital processing device, comprising software code portions for performing the steps of the method as described herein.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Examples described herein suggest using at least one AC-magnetic field generator (AC: Alternating Current), which applies at least one magnetic field to the magnetic field sensor element, which is subject to the magnetic crosstalk.

It is noted that the AC-magnetic field generator may produce signals that could be, but are not limited to sinusoidal waveforms. The AC-magnetic field generator may in particular compile any signals that vary over time. The shape of the signal may be known to the system or application. One example for such signal compiled by the AC-magnetic field generator is a pulse sequence.

A bandwidth of the useful signal may be separated in a way that allows a differentiation between the magnetic field component that is based on the signal generated by the AC-magnetic field generator from the magnetic field component (to be) measured.

In the example described herein it is assumed that the sensor element ideally responds to the magnetic field component $B_y$. Then the AC magnetic field generator is able to apply magnetic fields in x or z direction, i.e. magnetic field components $B_x$ or $B_z$.

In the absence of any magnetic crosstalk, the sensor element would not produce any results based on the magnetic field components $B_x$ or $B_z$. However, in the presence of magnetic crosstalk, the sensor element responds to the magnetic field components $B_x$ and/or $B_z$.

Figure 1:
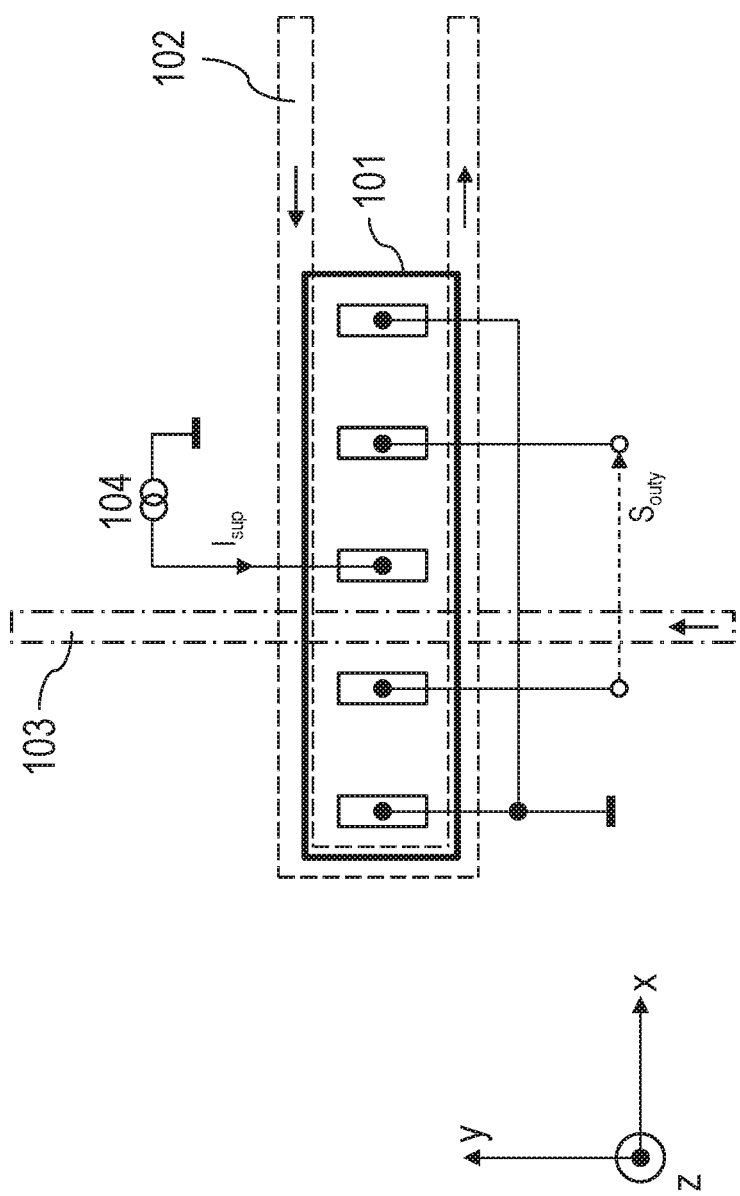
FIG. 1 shows a Vertical Hall effect device (VHall) aligned along an x-direction to detect the magnetic field component $B_y$.

FIG. 1 shows as an exemplary sensor element 101 a Vertical Hall effect device (VHall) aligned along an x-direction to detect the magnetic field component $B_y$. The sensor element 101 is shown in a top view perspective, i.e. a view onto a surface of a chip. The sensor element 101 comprises five contacts, wherein the outer two contacts are connected to ground and the contact in the middle is connected via a current source 104 to ground. The current source 104 supplies a current $I_{sup}$. Between the second and the fourth contact, an output signal $S_{outy}$ is provided.

A first example of the AC-magnetic field generator is a wire 103 above the sensor element 101. This wire 103 is aligned in y-direction, in order to apply the magnetic field component $B_x$.

A second example of the magnetic field generator is a wire 102 above the sensor element 101. This wire 102 has the shape of a semi-loop or loop around the sensor element 101 in order to generate the magnetic field component $B_z$.

Hence, FIG. 1 shows an example of how the sensor element 101 can be supplied with additional magnetic field components $B_x$ and $B_z$ via AC-magnetic field generators.

The magnetic field component $B_y$ may in particular be determined via the following steps (1)-(6), provided below:

(1) Provide AC-magnetic field generators to apply magnetic field components $B_x'$ and $B_z'$ (preferably at a high alignment accuracy).

For example, coils may be provided, which are implemented on an interconnect layer of a chip in the vicinity of the Hall elements.

A known current Ix' and Iz' is injected into the coils.

The coils have coil constants CCx and CCz (which are known by design, e.g., by numerical simulation). Hence, the following applies:

$$B_x' = CC_x \cdot I_x' \text{ and}$$

$$B_z' = CC_z \cdot I_z'.$$

Hence, the magnetic field components $B_x'$ and $B_z'$ supplied by the AC-magnetic field generators are known.

(2) The magnetic field components $B_x'$ and $B_z'$ are supplied using an AC at different frequencies, i.e. a frequency $f_x'$ for the magnetic field component $B_x'$ and a frequency $f_z'$ for the magnetic field component $B_z'$. Preferably, each of the frequencies $f_x'$ and $f_z'$ is different from a bandwidth expected for the frequency of the magnetic field component $B_y$.

(3) A signal path is provided to extract the magnetic field components $B_x'$ and $B_z'$.

For example, filters can be provided to filter the frequencies $f_x'$ and $f_z'$. The output signals provided via such filters across the signal paths amount to:

$$S_{yx} \cdot B_x' \text{ and}$$

$$S_{yz} \cdot B_z'$$

which are measured and/or recorded by the system.

(4) A sensitivity matrix $\{S_{yx}, S_{yy}, S_{yz}\}$ is estimated.

The sensitivity $S_{yy}$ is given by design. It may for example be known as the geometry and the material parameters of the Hall element are defined by the layout and the technology of the semiconductor process. It may also depend on the supply current of the Hall element, which is determined by the circuit.

The system divides the two recorded signals by $B_x$ and $B_y'$ (which are known to the system, see above) and thus obtains the sensitivities $S_{yx}$ and $S_{yz}$.

(5) The magnetic field components $B_x$ and $B_z$ (within the bandwidth of the useful signal comprising the bandwidth of the magnetic field components measured) are determined.

This can be achieved using two magnetic field sensors such as, e.g., Hall sensors or MR sensors, one for each magnetic field component $B_x$ and $B_z$.

(6) The following equation is solved for the magnetic field component $B_y$:

$$S_{outy}=S_{yx}\cdot B_x+S_{yy}\cdot B_y+S_{yz}\cdot B_z.$$

Hence:

$$B_y = \frac{S_{outy} - S_{yx} \cdot B_x - S_{yz} \cdot B_z}{S_{yy}}.$$

Souty is known as the output signal of the main signal path, i.e. the low frequency baseband (at a frequency $f_0$), which is below the frequencies $f_x'$ and $f_z'$.

$S_{yx}$ is the sensitivity based on the recorded signal $S_{yx} B_x'$, which is divided by the known magnetic field component $B_x'$. $B_x$ is the magnetic field component detected by an additional Hall sensor.

$S_{yz}$ is the sensitivity based on the recorded signal $S_{yz} B_z'$, which is divided by the known magnetic field component $B_z'$. $B_z$ is the magnetic field component detected by yet another Hall sensor.

The sensitivity $S_{yy}$ is known by design.

Figure 2:
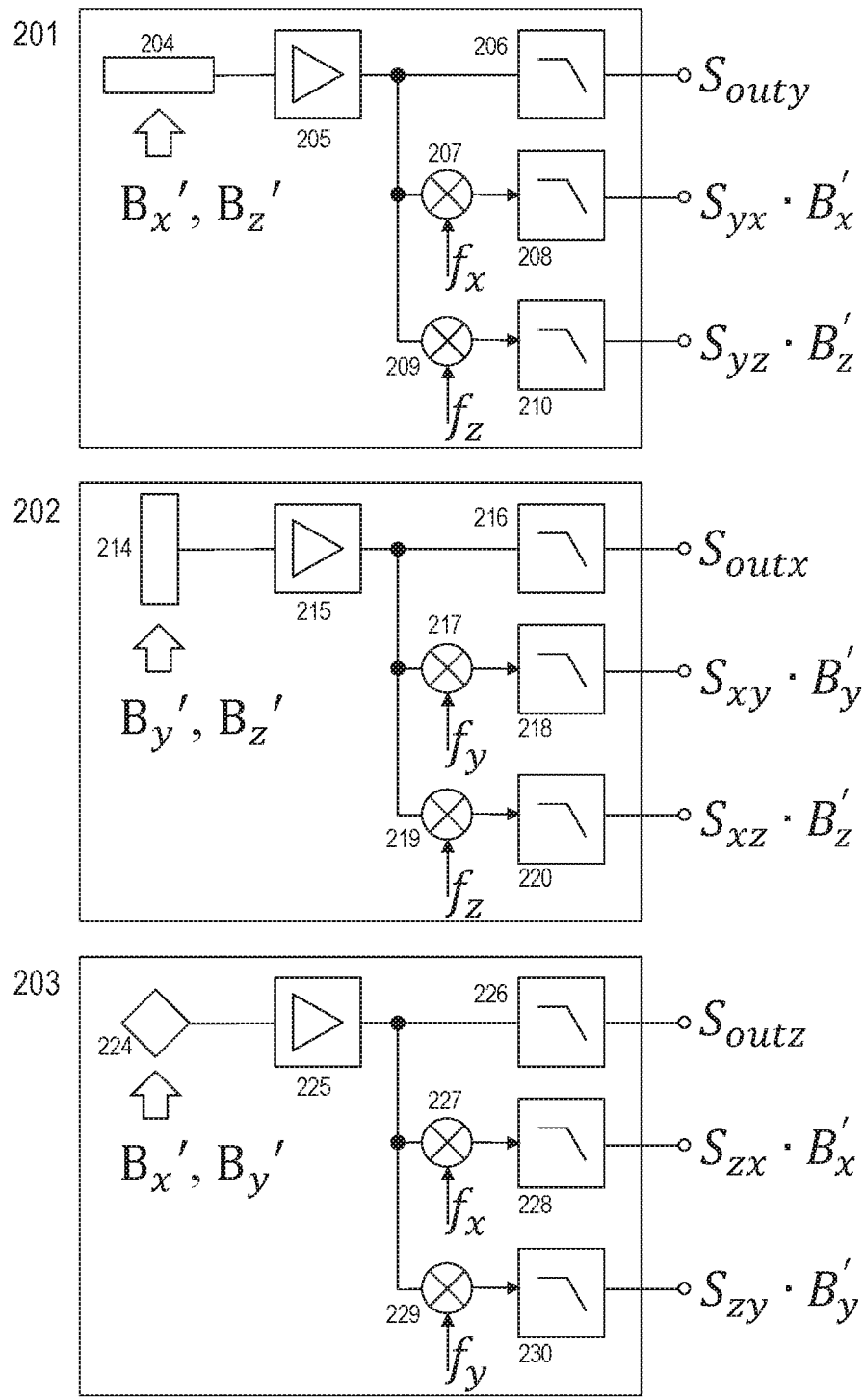
FIG. 2 shows an exemplary arrangement comprising a sensing element for an y-channel to determine the magnetic field component $B_y$, a sensing element for an x-channel to determine the magnetic field component $B_x$ and a sensing element for an z-channel to determine the magnetic field component $B_z$.

FIG. 2 shows an exemplary arrangement comprising a sensing element 201 for a y-channel to determine the magnetic field component $B_y$, a sensing element 202 for an x-channel to determine the magnetic field component $B_x$ and a sensing element 203 for a z-channel to determine the magnetic field component $B_z$.

The sensing element 201 comprises a sensor element 204 (e.g., a magnetic field sensor like the vertical Hall effect device, VHall), an amplifier 205, a low-pass filter 206, a demodulator 207, a low-pass filter 208, a demodulator 209 and a low-pass filter 210.

The sensing element 201 further comprises wires or coils to apply AC-magnetic fields in crosstalk directions, i.e. $B_x'$ and $B_z'$. These magnetic fields that stem from the AC-magnetic field generator, identified with an apostrophe, can also be regarded as magnetic fields used for calibration purposes. They may preferably be generated internally, i.e., within the sensing element 201. In contrast, magnetic fields not generated by an AC-magnetic field generator may be referred to as external magnetic fields and are identified herein without an apostrophe (e.g., $B_x$ and $B_z$).

As explained above, an AC-magnetic field generator supplies a magnetic field component $B_x'$ at a frequency $f_x$ and another AC-magnetic field generator supplies a magnetic field component $B_z'$ at a frequency $f_z$, wherein both frequencies $f_x$ and $f_z$ are beneficially different from each other. The output of the sensor element 204 is conveyed via an amplifier to the low-pass filter 206, the demodulator 207, and the demodulator 209.

The demodulator 207 uses the frequency $f_x$, which is fed through the low-pass filter 208 to provide the output signal $S_{yx}\cdot B_x'$. Preferably, the frequency supplied to the demodulator and the frequency supplied to the AC-magnetic field generator are phase-locked.

The demodulator 209 uses the frequency $f_z$, which is fed through the low-pass filter 210 to provide the output signal $S_{yz}\cdot B_z'$.

Demodulation, as used herein, extracts the AC signal generated by the AC-magnetic field generator from the total output signal of the magnetic sensor. To this end, a respective demodulator shifts the output signal in frequency based on the used frequency and filters an appropriate band of frequencies based on the used frequency. The result is a demodulated output signal (i.e., the AC signal) that has signal components that include the sensitivity and the measured magnetic field component that correspond to the frequency used for the demodulation. For example, in reference to demodulator 207 that uses frequency $f_x$ for the demodulation, the demodulated output signal includes the product of the x-sensitivity $S_{yx}$ and the measured Bx' field component. The signal components that correspond to other frequencies (e.g., $f_y$ and $f_z$) are filtered out by the demodulation.

The low pass filter 206 may have a cutoff frequency that is smaller than any of the frequencies $f_x$ and $f_z$. The low pass filter 208 may have a cutoff frequency that is smaller than the frequency $f_x$ and the low pass filter 210 may have a cutoff frequency that is smaller than the frequency $f_z$. Thus, the bandwidth of the signal path that includes low pass filter 206 and configured to detect the magnetic field component By is different from the bandwidths of the signal paths, corresponding to low pass filters 208 and 210, configured to detect/extract the AC-generated magnetic field components.

The above applies in analogy for the sensing elements 202 and 203:

The sensing element 202 comprises a sensor element 214 (e.g., a magnetic field sensor like the vertical Hall effect device, VHall), an amplifier 215, a low-pass filter 216, a demodulator 217, a low-pass filter 218, a demodulator 219 and a low-pass filter 220.

The sensing element 202 further comprises wires or coils to apply AC-magnetic fields in crosstalk directions, i.e. $B_y'$ and $B_z'$. These magnetic fields that stem from the AC-magnetic field generator can also be regarded as magnetic fields used for calibration purposes. They may preferably be generated internally, i.e. within the sensing element 202.

As explained above, an AC-magnetic field generator supplies a magnetic field component $B_y'$ at a frequency $f_y$ and another AC-magnetic field generator supplies a magnetic field component $B_z'$ at a frequency $f_z$, wherein both frequencies $f_y$ and $f_z$ are beneficially different from each other. The output of the sensor element 214 is conveyed via an amplifier to the low-pass filter 216, the demodulator 217, and the demodulator 219.

The demodulator 217 uses the frequency $f_y$, which is fed through the low-pass filter 218 to provide the output signal $S_{xy}\cdot B_y'$.

The demodulator 219 uses the frequency $f_z$, which is fed through the low-pass filter 220 to provide the output signal $S_{xz}\cdot B_z'$.

The low pass filters 216 may have a cutoff frequency that is smaller than any of the frequencies $f_y$ and $f_z$. The low pass filter 218 may have a cutoff frequency that is smaller than the frequency $f_y$ and the low pass filter 220 may have a cutoff frequency that is smaller than the frequency $f_z$.

The sensing element 203 comprises a sensor element 224 (e.g., a magnetic field sensor like the Hall plate), an amplifier 225, a low-pass filter 226, a demodulator 227, a low-pass filter 228, a demodulator 229 and a low-pass filter 230.

The sensing element 203 further comprises wires or coils to apply AC-magnetic fields in crosstalk directions, i.e. $B_x'$ and $B_y'$. These magnetic fields that stem from the AC-magnetic field generator can also be regarded as magnetic fields used for calibration purposes. They may preferably be generated internally, i.e. within the sensing element 203.

As explained above, an AC-magnetic field generator supplies a magnetic field component Bx' at a frequency $f_x$ and another AC-magnetic field generator supplies a magnetic field component $B_y'$ at a frequency $f_y$, wherein both frequencies $f_x$ and $f_y$ are beneficially different from each other. The output of the sensor element 224 is conveyed via an amplifier to the low-pass filter 226, the demodulator 227, and the demodulator 229.

The demodulator 227 uses the frequency $f_x$, which is fed through the low-pass filter 228 to provide the output signal $S_{zx} \cdot B_x'$.

The demodulator 229 uses the frequency $f_y$, which is fed through the low-pass filter 230 to provide the output signal $S_{zy} \cdot B_y'$.

The low pass filters 226 may have a cutoff frequency that is smaller than any of the frequencies $f_x$ and $f_y$. The low pass filter 228 may have a cutoff frequency that is smaller than the frequency $f_x$ and the low pass filter 230 may have a cutoff frequency that is smaller than the frequency $f_y$.

The sensor elements 204, 214 and 224 each senses magnetic field components that are orthogonal to one another.

The output signals of the sensing elements 201 to 203 are as follows:

$$S_{outy} = S_{yx} \cdot B_x + S_{yy} \cdot B_y + S_{yz} \cdot B_z,$$

$$S_{outx} = S_{xx} \cdot B_x + S_{xy} \cdot B_y + S_{xz} \cdot B_z,$$

$$S_{outz} = S_{zx} \cdot B_x + S_{zy} \cdot B_y + S_{zz} \cdot B_z,$$

The sensing element 201 uses the demodulators 207 and 209 to determine (e.g. estimate) the crosstalk sensitivities $S_{yx}$ and $S_{yz}$ to a y-sensing direction or channel.

The sensing element 202 uses the demodulators 217 and 219 to determine (e.g. estimate) the crosstalk sensitivities $S_{xy}$ and $S_{xz}$ to an x-sensing direction or channel.

The sensing element 203 uses the demodulators 227 and 229 to determine (e.g. estimate) the crosstalk sensitivities $S_{zx}$ and $S_{zy}$ to a z-sensing direction or channel.

The three equations above can be summarized in vector form as follows:

$$\begin{pmatrix} S_{outx} \\ S_{outy} \\ S_{outz} \end{pmatrix} = \begin{bmatrix} S_{xx} & S_{xy} & S_{xz} \\ S_{yx} & S_{yy} & S_{yz} \\ S_{zx} & S_{zy} & S_{zz} \end{bmatrix} \begin{pmatrix} B_x \\ B_y \\ B_z \end{pmatrix} = S \cdot \begin{pmatrix} B_x \\ B_y \\ B_z \end{pmatrix}.$$

The sensitivity matrix S contains the sensitivities, which are either known by design (for $S_{xx}$, $S_{yy}$, $S_{zz}$) or determined via the calibration fields, i.e. the electromagnetic components $B_x'$, $B_y'$ and $B_z'$ that result from the AC magnetic field generators utilizing the frequencies $f_x$, $f_y$ and $f_z$.

The sensitivity matrix S can be inverted into $S^{-1}$. The magnetic field components $B_x$, $B_y$ and $B_z$ can be determined via this inverted sensitivity matrix $S^{-1}$ as follows:

$$\begin{pmatrix} B_x \\ B_y \\ B_z \end{pmatrix} = S^{-1} \cdot \begin{pmatrix} S_{outx} \\ S_{outy} \\ S_{outz} \end{pmatrix}.$$

Hence, a system with three sensing elements 201, 202 and 203 (also referred to as 3D-system) allows calculating all three orthogonal magnetic field components $B_x$, $B_y$ and $B_z$ in a single step.

Each sensing element 201 to 203 may in particular have two AC magnetic field generators (coils), which apply magnetic field components in the respective other two directions than the nominal sensing direction of the sensing element.

The demodulators and attached low-pass filters allow extracting the signals of the coils and measuring (estimating) the cross-sensitivities (i.e. sensitivities with different indices).

It is noted that any of the amplifiers 205, 215 or 225 is optional.

Further embodiments and advantages are described below.

In the exemplary embodiment shown in FIG. 2, there is no wire or coil to establish an AC-magnetic field generator in the direction of the magnetic field component of the respective sensing element, i.e. no generation of a magnetic field component $B_y'$ is generated for the sensing element 201, no magnetic field component $B_x'$ is generated for the sensing element 202 and no magnetic field component $B_z'$ is generated for the sensing element 203. This is an option, because the sensitivities $S_{xx}$, $S_{yy}$, and $S_{zz}$ may be known by design.

However, it is an option to also provide AC-magnetic field generators for these additional magnetic field components in order to determine the sensitivities $S_{xx}$, $S_{yy}$ and $S_{yy}$. This may in particular be applicable, if the accuracy of the sensitivities $S_{xx}$, $S_{yy}$ and $S_{zz}$ would otherwise be too low. In this case, the main magnetic field component may be stimulated via an additional frequency $f_x$, $f_y$, $f_z$ (in case of the sensing element 201: the frequency $f_y$; in case of the sensing element 202: the frequency $f_x$ and in case of the sensing element 203: the frequency $f_z$). Also, a demodulator using this additional frequency and a subsequent low pass filter has to be provided.

If only a single magnetic field component (e.g., the magnetic field component $B_y$) has to be measured by the system with high accuracy, only the sensing element 201 (which detects the y-direction) may have to be provided with AC-magnetic field generators that provide crosstalk-calibration fields $B_x'$ and $B_y'$. In such scenario, the system uses the sensing elements 202 and 203 (both in this scenario without AC-magnetic field generators) to measure the magnetic field components $B_x$ and $B_y$ with moderate accuracy. This may still be sufficient and useful for an overall accuracy, because the magnetic field components $B_x$ and $B_y$ are only of minor importance for the measurement of the magnetic field component $B_y$ (they are errors of second order for the measurement of the magnetic field component By).

Magnetic sensors (Halls) with wire-on-chip for autocalibration is known. However, the difference is in conventional systems, the wire-on-chip generates a Bz-field on the z-Hall, a Bx-field on the x-VHall, and a By-field on the y-VHall.

It is another option that only two sensing elements are provided to detect the magnetic field components $B_x$ and $B_y$. Such use case may in particular become important in case no (significant) magnetic field component $B_z$ affects any of the sensor elements of the sensing elements (201 and 202 in FIG. 2). Such application may be beneficial for a high-precision angle sensor measurement (in this case regarding the angle between the magnetic field components $B_x$ and $B_y$).

It is further an option that an electric shield or any electric shielding means is placed between conducting paths used for the generations of the AC signals (by the AC-magnetic field generator) and the magnetic sensors. This avoids unwanted electric coupling. The electric shield is preferably coupled to ground. In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A sensing element, comprising:
   a magnetic sensor configured to detect a first external magnetic field component;
   at least one alternating current (AC)-magnetic field generator that applies at least one additional magnetic field component at at least one predetermined frequency to the magnetic sensor, wherein each of the at least one additional magnetic field component is orthogonal to the first external magnetic field component, wherein the magnetic sensor generates an output signal based on the first external magnetic field component and the at least one additional magnetic field component;
   at least one demodulator configured to use the at least one predetermined frequency to demodulate the output signal to generate a demodulated output signal; and
   at least one processor configured to determine a sensitivity of the magnetic sensor respective to the at least one additional magnetic field component based on the demodulated output signal.

2. The sensing element according to claim 1, wherein the at least one processor is configured to determine the first external magnetic field component based on the at least one additional magnetic field component being supplied by the at least one AC-magnetic field generator and based on at least one additional magnetic sensor that detects at least one additional external magnetic field component.

3. The sensing element according to claim 2, wherein the at least one processor configured is configured to determine the first external magnetic field component, further defined as $B_i$, by:
   determining the sensitivity, defined as:

$$S_{ij} \text{ with } i,j \in \{x,y,z\} \text{ and } i \neq j$$

based on the demodulated output signal, further defined as $S_{ij} \cdot B'_j$, divided by a first additional magnetic field component, defined as $B'_j$, of the at least one additional magnetic field component as applied by the at least one AC-magnetic field generator, and
   multiplying the determined sensitivity $S_{ij}$ with a second external magnetic field component, defined as $B_j$, determined by the at least one additional magnetic sensor,
   wherein i represents a direction i of the first external magnetic field component, $B_i$, and j represents a direction j that is orthogonal to the direction i.

4. The sensing element according to claim 2, wherein the at least one processor configured is configured to determine the first external magnetic field component, $B_i$, based on:

$$B_i = \frac{S_{outi} - S_{ij} \cdot B_j}{S_{ii}},$$

wherein $S_{outi}$ is the output signal of the magnetic sensor,
wherein $S_{ii}$ is a predefined sensitivity of the magnetic sensor,
wherein $S_{ij}$ is the determined sensitivity,
wherein $B_j$ is a second external magnetic field component aligned in a direction j and determined by the at least one additional magnetic sensor, and
wherein i represents a direction i of the first external magnetic field component, $B_i$, and j represents the direction j that is orthogonal to the direction i.

5. The sensing element according to claim 1, wherein each AC-magnetic field generator of the at least one AC-magnetic field generator is electrically shielded from the magnetic sensor.

6. The sensing element according to claim 1, wherein the magnetic sensor is selected from a group consisting of:
a Vertical Hall effect device,
a Hall plate, and
a magnetoresistive sensor, wherein the magnetoresistive sensor is selected from a group consisting of:
an anisotropic magnetoresistive sensor (AMR) sensor,
a giant magnetoresistive sensor (GMR) sensor, and
a tunneling magnetoresistive sensor (TMR) sensor.

7. The sensing element according to claim 1, wherein:
each of the at least one predetermined frequency is different from a frequency of the first external magnetic field component, or
a bandwidth of each of the at least one additional magnetic field component is different from a bandwidth with which the sensing element detects the first external magnetic field component.

8. The sensing element according to claim 1, wherein the at least one AC-magnetic field generator comprises a wire or a coil.

9. The sensing element according to claim 1, wherein the at least one AC-magnetic field generator is realized as a wire or coil on a chip.

10. A sensing system configured to determine at least one external magnetic field component, comprising:
a first magnetic sensing element configured to detect a first external magnetic field component By in a y-direction, the first magnetic sensing element comprising:
a first magnetic sensor configured to generate a first output signal;
a first alternating current (AC)-magnetic field generator configured to apply a first additional magnetic field component Bx' to the first magnetic sensor, the first additional magnetic field component Bx' being applied in an x-direction as a first crosstalk signal; and
a first signal path coupled to the first magnetic sensor and configured to extract a first extracted signal $S_{yx} \cdot B'_x$ from the first output signal, wherein $S_{yx}$ is an x-sensitivity of the first magnetic sensor in the x-direction;
a second magnetic sensing element configured to detect a second external magnetic field component Bx in the x-direction, the second magnetic sensing element comprising:
a second magnetic sensor configured to generate a second output signal;
a second AC-magnetic field generator configured to apply a second additional magnetic field component By' to the second magnetic sensor, the second additional magnetic field component By' being applied in a y-direction as a second crosstalk signal; and
a second signal path configured to extract a second extracted signal $S_{xy} \cdot B'_y$ from the second output signal, wherein $S_{xy}$ is a y-sensitivity of the second magnetic sensor in the y-direction; and
at least one processor configured to determine the first external magnetic field component By and the second external magnetic field component Bx based on:

$$\begin{pmatrix} B_x \\ B_y \end{pmatrix} = \begin{bmatrix} S_{xx} & S_{xy} \\ S_{yx} & S_{yy} \end{bmatrix}^{-1} \cdot \begin{pmatrix} S_{outx} \\ S_{outy} \end{pmatrix},$$

wherein:
$S_{outx}$ is the second output signal of the second magnetic sensor,
$S_{outy}$ is the first output signal of the first magnetic sensor,
wherein the x-sensitivity $S_{yx}$ is determined based on the first extracted signal $S_{yx} \cdot B'_x$ divided by the first additional magnetic field component Bx' as applied by the first AC-magnetic field generator, and
wherein the y-sensitivity $S_{xy}$ is determined based on the second extracted signal $S_{xy} \cdot B'_y$ divided by the second additional magnetic field component By' as applied by the second AC-magnetic field generator.

11. The sensing system according to claim 10, wherein:
the first magnetic sensing element further comprises:
a third AC-magnetic field generator configured to apply a third additional magnetic field component Bz' to the first magnetic sensor, the third additional magnetic field component Bz' being applied in a z-direction as a third crosstalk signal; and
a third signal path configured to extract a third extracted signal $S_{yz} \cdot B'_z$ from the first output signal, wherein $S_{yz}$ is a z-sensitivity of the first magnetic sensor in the z-direction,
the second magnetic sensing element further comprises:
a fourth AC-magnetic field generator configured to apply a fourth additional magnetic field component Bz' to the second magnetic sensor, the fourth additional magnetic field component Bz' being applied in the z-direction as a fourth crosstalk signal; and
a fourth signal path configured to extract a fourth extracted signal $S_{xz} \cdot B'_z$ from the second output signal, wherein $S_{xz}$ is a z-sensitivity of the second magnetic sensor in the z-direction,
the sensing system further comprising a third magnetic sensing element configured to detect a third external magnetic field component Bz in the z-direction, the third magnetic sensing element comprising:
a third magnetic sensor configured to generate a third output signal;
a fifth AC-magnetic field generator configured to apply a fifth additional magnetic field component Bx' to the third magnetic sensor, the fifth additional magnetic field component Bx' being applied in the x-direction as a fifth crosstalk signal;
a sixth AC-magnetic field generator configured to apply a sixth additional magnetic field component By' to the third magnetic sensor, the sixth additional magnetic field component By' being applied in the y-direction as a sixth crosstalk signal;

a fifth signal path configured to extract a fifth extracted signal $S_{zx} \cdot B'_x$ from the third output signal, wherein $S_{zx}$ is an x-sensitivity of the third magnetic sensor in the x-direction; and a sixth signal path configured to extract a sixth extracted signal $S_{zy} \cdot B'_y$ from the third output signal, wherein $S_{zy}$ is a y-sensitivity of the third magnetic sensor in the y-direction, wherein the at least one processor is configured to determine the first, the second, and the third external magnetic field components $B_x$, $B_y$, $B_z$, respectively, based on:

$$\begin{pmatrix} B_x \\ B_y \\ B_z \end{pmatrix} = \begin{bmatrix} S_{xx} & S_{xy} & S_{xz} \\ S_{yx} & S_{yy} & S_{yz} \\ S_{zx} & S_{zy} & S_{zz} \end{bmatrix}^{-1} \cdot \begin{pmatrix} S_{outx} \\ S_{outy} \\ S_{outz} \end{pmatrix},$$

wherein:

$S_{outz}$ is the third output signal of the third magnetic sensor, wherein i represents a direction i selected from x, y, and z, wherein j represents a direction j that is orthogonal to the direction i, wherein the at least one processor is configured to determine sensitivities $S_{ij}$ with i,j $\in$ {x, y, z} and i≠j based on extracted signals $S_{ij} \cdot B'_j$ divided by an additional magnetic field component $B'_j$ as applied by a respective AC-magnetic field generator, wherein the sensitivities $S_{ij}$ include $S_{yx}$, $S_{xy}$, $S_{yz}$, $S_{xz}$, $S_{zx}$, and $S_{zy}$.

12. The sensing system according to claim 10, wherein:
the first AC-magnetic field generator applies the first additional magnetic field component Bx' at a first frequency,
the second AC-magnetic field generator applies the second additional magnetic field component By' at a second frequency,
the first signal path comprises a first demodulator configured to use the first frequency to demodulate the first output signal to generate the first extracted signal, and
the second signal path comprises a second demodulator configured to use the second frequency to demodulate the second output signal to generate the second extracted signal.

13. The sensing system according to claim 12, wherein:
the first frequency of the first additional magnetic field component Bx' is different from a frequency of the first external magnetic field component By, and the second frequency of the second additional magnetic field component By' is different from a frequency of the second magnetic field component Bx, or
the first magnetic sensing element comprises a third signal path having a bandwidth configured to detect the first external magnetic field component By, the second magnetic sensing element comprises a fourth signal path having a bandwidth configured to detect the second external magnetic field component Bx, a bandwidth of the first additional magnetic field component Bx' is different from the bandwidth of the third signal path, and a bandwidth of the second additional magnetic field component By' is different from the bandwidth of the fourth signal path.

14. The sensing system according to claim 10, wherein the first AC-magnetic field generator and the second AC-magnetic field generator are electrically shielded from the first magnetic sensor and the second magnetic sensor.

15. The sensing system according to claim 10, wherein the first magnetic sensor and the second magnetic sensor are selected from a group consisting of:
a Vertical Hall effect device, and
a Hall plate.

16. A method for calculating a first external magnetic field component, comprising:
generating a first output signal based on detecting the first external magnetic field component by a first magnetic sensor;
applying, via an alternating current (AC)-magnetic field generator, an additional magnetic field component at a predetermined frequency to the first magnetic sensor, wherein the first magnetic field component and the additional magnetic field component are orthogonal to each other;
calculating a sensitivity of the first magnetic sensor respective to the additional magnetic field component using the predetermined frequency; and
determining the first external magnetic field component based on the additional magnetic field component supplied by the AC-magnetic field generator and based on a second external magnetic field component detected by a second magnetic sensor, wherein the additional magnetic field component and the second external magnetic field component are parallel to each other.

17. The method according to claim 16, wherein determining the first magnetic field component, further defined as $B_i$, comprises:
demodulating the output signal using the predetermined frequency to generate a demodulated output signal, $S_{ij} \cdot B'_j$;
determining the sensitivity, defined as:

$$S_{ij} \text{ with } i,j \in \{x,y,z\} \text{ and } i \neq j$$

based on the demodulated output signal, $S_{ij} \cdot B'_j$, divided by the additional magnetic field component, defined as $B'_j$, as applied by the AC-magnetic field generator, wherein i represents a direction i of the first external magnetic field component, $B_i$, and j represents a direction j that is orthogonal to the direction i; and
multiplying the determined sensitivity $S_{ij}$ with the second external magnetic field component, defined as $B_j$.

18. The method according to claim 17, further comprising:
determining the first magnetic field component, $B_i$, based on:

$$B_i = \frac{S_{outi} - S_{ij} \cdot B_j}{S_{ii}},$$

wherein $S_{outi}$ is the first output signal
wherein $S_{ii}$ is a predefined sensitivity of the first magnetic sensor,
wherein $S_{ij}$, is the determined sensitivity, and
wherein $B_j$ is the second external magnetic field component aligned in the direction j and determined by the second magnetic sensor i.

19. A method for calculating at least one external magnetic field component, comprising:

detecting a first external magnetic field component $B_y$ in a y-direction by a first magnetic sensor;
generating, by a first alternating current (AC)-magnetic field generator, a first additional magnetic field component Bx' in an x-direction that is orthogonal to the y-direction;
applying the first additional magnetic field component Bx' to the first magnetic sensor as a first crosstalk signal;
generating a first output signal by the first magnetic sensor based on the first external magnetic field component $B_y$ and the first additional magnetic field component $B_x'$;
extracting a first extracted signal $S_{yx} \cdot B'_x$ from the first output signal, wherein $S_{yx}$ is an x-sensitivity of the first magnetic sensor in the x-direction;
detecting a second external magnetic field component $B_x$ in the x-direction by a second magnetic sensor;
generating, by a second AC-magnetic field generator, a second additional magnetic field component By' in the y-direction;
applying the second additional magnetic field component By' to the second magnetic sensor as second crosstalk signal;
extracting a first extracted signal $S_{xy} \cdot B'_y$ from the second output signal, wherein $S_{xy}$ is a y-sensitivity of the second magnetic sensor in the y-direction; and
determining the first external magnetic field component By and the second external magnetic field component Bx based on:

$$\begin{pmatrix} B_x \\ B_y \end{pmatrix} = \begin{bmatrix} S_{xx} & S_{xy} \\ S_{yx} & S_{yy} \end{bmatrix}^{-1} \cdot \begin{pmatrix} S_{outx} \\ S_{outy} \end{pmatrix},$$

wherein:
$S_{outx}$ is the second output signal of the second magnetic sensor,
$S_{outy}$ is the first output signal of the first magnetic sensor,
wherein i represents a direction i of the first magnetic field component, $B_i$, and j represents a direction j that is orthogonal to the direction i,
wherein the x-sensitivity $S_{yx}$ is determined based on the first extracted signal $S_{yx} \cdot B'_x$ divided by the first additional magnetic field component Bx' as applied by the first AC-magnetic field generator, and
wherein the y-sensitivity $S_{xy}$ is determined based on the second extracted signal $S_{xy} \cdot B y'$ divided by the second additional magnetic field component By' as applied by the second AC-magnetic field generator.

20. The method according to claim 19, further comprising:
applying a third additional magnetic field component Bz' to the first magnetic sensor by a third AC-magnetic field generator, the third additional magnetic field component Bz' being applied in a z-direction as a third crosstalk signal;
extracting a third extracted signal $S_{yz} \cdot B'_z$ from the first output signal, wherein $S_{yz}$ is a z-sensitivity of the first magnetic sensor in the z-direction;
applying a fourth additional magnetic field component Bz' to the second magnetic sensor by a fourth AC-magnetic field generator, the fourth additional magnetic field component Bz' being applied in the z-direction as a fourth crosstalk signal;
extracting a fourth extracted signal $S_{xz} \cdot B'_z$ from the second output signal, wherein $S_{xz}$ is a z-sensitivity of the second magnetic sensor in the z-direction;
detecting a third external magnetic field component Bz in the z-direction by a third magnetic sensor;
applying a fifth additional magnetic field component Bx' to a third magnetic sensor by a fifth AC-magnetic field generator, the fifth additional magnetic field component Bx' being applied in the x-direction as a fifth crosstalk signal;
applying a sixth additional magnetic field component By' to the third magnetic sensor by a sixth AC-magnetic field generator, the sixth additional magnetic field component By' being applied in the y-direction as a sixth crosstalk signal;
generating a third output signal by the third magnetic sensor;
extracting a fifth extracted signal $S_{zx} \cdot B'_y$ from the third output signal, wherein $S_{zx}$ is an x-sensitivity of the third magnetic sensor in the x-direction;
extracting a sixth extracted signal $S_{zy} \cdot B'_y$ from the third output signal, wherein $S_{zy}$ is a y-sensitivity of the third magnetic sensor in the y-direction; and
determining the first, the second, and the third external magnetic field components $B_x$, $B_y$, $B_z$, respectively, based on:

$$\begin{pmatrix} B_x \\ B_y \\ B_Z \end{pmatrix} = \begin{bmatrix} S_{xx} & S_{xy} & S_{xz} \\ S_{yx} & S_{yy} & S_{yz} \\ S_{zx} & S_{zy} & S_{zz} \end{bmatrix}^{-1} \cdot \begin{pmatrix} S_{outx} \\ S_{outy} \\ S_{outz} \end{pmatrix},$$

wherein:
$S_{outz}$ is the third output signal of the third magnetic sensor,
wherein sensitivities $S_{ij}$ with i,j $\in$ {x, y, z} and i≠j are determined based on extracted signals $S_{ij} \cdot B'_j$ divided by an additional magnetic field component $B'_j$ as applied by a respective AC-magnetic field generator, wherein the sensitivities $S_{ij}$ include $S_{yx}$, $S_{xy}$, $S_{yz}$, $S_{xz}$, $S_{zx}$, and $S_{zy}$.

21. The method according claim 19, wherein:
the first additional magnetic field component Bx' is applied at a first frequency,
the second additional magnetic field component By' is applied at a second frequency,
extracting the first extracted signal comprises demodulating the first output signal using the first frequency to generate the first extracted signal, and
extracting the second extracted signal comprises demodulating the second output signal using the second frequency to generate the second extracted signal.

22. A sensing device, comprising:
a first magnetic sensor configured to detect a first external magnetic field component;
an alternating current (AC)-magnetic field generator that applies an additional magnetic field component at a predetermined frequency to the first magnetic sensor, wherein the additional magnetic field component is orthogonal to the first external magnetic field component, wherein the first magnetic sensor generates an output signal based on the first external magnetic field component and the additional magnetic field component;
a demodulator configured to use the predetermined frequency to demodulate the output signal to generate a demodulated output signal; and
at least one processor configured to determine a sensitivity of the first magnetic sensor respective to the additional magnetic field component based on the demodulated output signal.

23. The sensing device according to claim 22, wherein the at least one processor is configured to determine the first external magnetic field component based on the additional magnetic field component being supplied by the AC-magnetic field generator and based on a second magnetic sensor that detects a second external magnetic field component.

24. The sensing device according to claim 23, wherein the at least one processor configured is configured to determine the first external magnetic field component, further defined as $B_i$, by:
   determining the sensitivity, defined as:

$$S_{ij} \text{ with } i,j \in \{x,y,z\} \text{ and } i \neq j$$

based on the demodulated output signal, further defined as $S_{ij} \cdot B'_j$, divided by the additional magnetic field component, defined as $B'_j$, as applied by the AC-magnetic field generator, and
   multiplying the determined sensitivity $S_{ij}$ with the second external magnetic field component, defined as $B_j$, determined by the second magnetic sensor,
   wherein i represents a direction i of the first external magnetic field component, $B_i$, and j represents a direction j that is orthogonal to the direction i.

25. The sensing device according to claim 23, the at least one processor configured is configured to determine the first external magnetic field component, further defined as $b \cdot$, based on:

$$B_i = \frac{S_{outi} - S_{ij} \cdot B_j}{S_{ii}},$$

wherein $S_{outi}$ is the output signal of the first magnetic sensor,
   wherein $S_{ii}$ is a predefined sensitivity of the first magnetic sensor,
   wherein $S_{ij}$ is the determined sensitivity,
   wherein $B_j$ is a second external magnetic field component aligned in a direction j and determined by the second magnetic sensor, and
   wherein i represents a direction i of the first external magnetic field component, $B_i$, and j represents the direction j that is orthogonal to the direction i.

26. The sensing device according to claim 23, wherein the second external magnetic field component is parallel to the additional magnetic field component.

* * * * *